United States Patent [19]

Nomura

[11] Patent Number: 5,182,478
[45] Date of Patent: Jan. 26, 1993

[54] VARIABLE BAND-PASS FILTER CIRCUIT
[75] Inventor: Hiroshi Nomura, Daito, Japan
[73] Assignee: Sanyo Electric Co., Ltd., Osaka, Japan
[21] Appl. No.: 767,783
[22] Filed: Sep. 30, 1991
[30] Foreign Application Priority Data Sep. 29, 1990 [JP] Japan .................. 2-260778

[51] Int. Cl.$^5$ .......................... H03B 1/00; H03K 5/00
[52] U.S. Cl. ................................. 307/521; 328/167
[58] Field of Search ............... 307/520, 521; 328/167; 330/107, 109

[56] References Cited

U.S. PATENT DOCUMENTS

| | | | |
|---|---|---|---|
| 4,257,018 | 3/1981 | Masdea et al. | 328/167 |
| 4,667,120 | 5/1987 | Okada et al. | 307/521 |
| 4,782,246 | 11/1988 | Kuroyanagi et al. | 328/155 |
| 4,818,903 | 11/1989 | Kawano | 307/521 |
| 5,023,491 | 6/1991 | Koyama | 328/167 |

FOREIGN PATENT DOCUMENTS 61-105107 5/1986 Japan .
61-281613 12/1986 Japan .
62-117407 5/1987 Japan .

OTHER PUBLICATIONS

"Realization of Monolithic Variable Integrators and Their Application to Automatically Tunable High-Frequency"; Electronics and Communications in Japan; vol. 71 No. 8; Aug. 1988; Silver Spring, Md.; pp. 32-41.
"Automatic Tuning of Quality Factors for VHF CMOS Filters"; 1990 IEEE Int. Symposium on Circuits and Systems May 1-3; vol. 2 of 4; Sheraton Hotel, New Orleans, La., pp. 1147-1150.
"Microminiaturization is Forcing Inductors Out"; Electronic Design; vol. 18 No. 19; Sep. 13, 1970; Hasbrouck Heights, NJ; pp. 27-30.

Primary Examiner—Timothy P. Callahan
Attorney, Agent, or Firm—Armstrong, Westerman, Hattoti, McLeland & Naughton

[57] ABSTRACT

A variable band-pass filter circuit includes a variable band-pass filter which filters an input signal such as a chrominance signal. An output the variable band-pass filter is phase-compared with a reference signal in a phase comparator. An output of the phase comparator is applied to the variable band-pass filter as a control signal. The output of the variable band-pass filter is level-limited by a limiter and then applied to an adder which further receives the reference signal. One of the input signal and an output of the adder is selected by a switch to be applied to an input of the variable band-pass filter. A reference signal component is removed by the sample hold circuit to be prevented from being outputted from an output of the variable ban-pass filter.

4 Claims, 5 Drawing Sheets

F I G. 4A
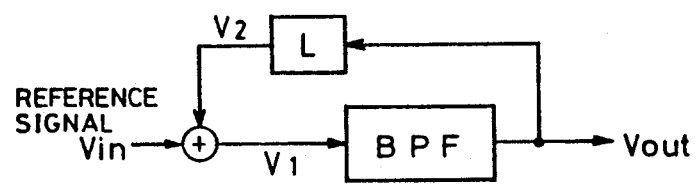
F I G. 4B
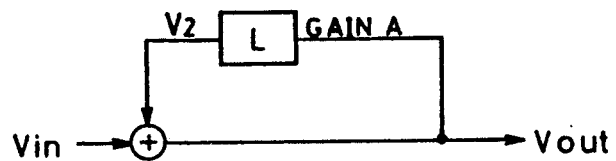

F I G. 7
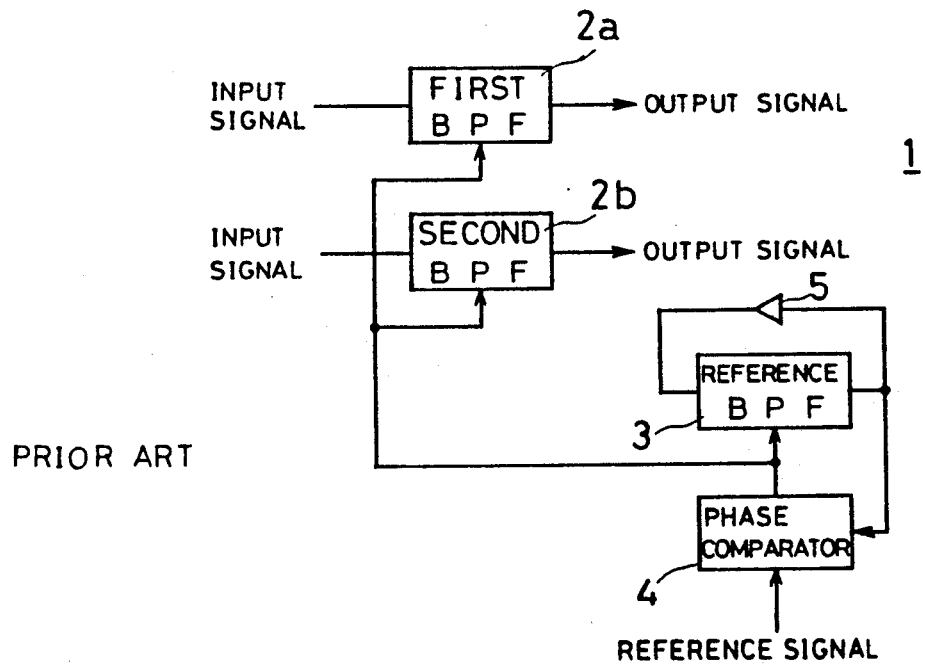
PRIOR ART

VARIABLE BAND-PASS FILTER CIRCUIT

BACKGROUND OF THE INVENTION

1. Field of the Invention

The present invention relates to a variable band-pass filter circuit. More specifically, the present invention relates to a control circuit which automatically controls a variable band-pass filter constructed within an integrated circuit.

2. Description of the Prior Art

Recently, an integrated circuit used in a video recording and reproducing apparatus such as a VTR has a tendency to be constructed such that the integrated circuit incorporates a variable band-pass filter and the variable band-pass filter is automatically adjusted within the integrated circuit or from the outside.

Conventionally, as a method for automatically controlling such a kind of variable band-pass filter (hereinafter, simply called as "BPF"), a method shown in FIG. 6 or FIG. 7 is known.

In a conventional circuit 1, a first and second BPF's 2a and 2b which are to be controlled and a reference BPF 3 are used. The BPF's 2a, 2b and 3 are formed by the same circuit configuration, the same constants and the same pattern configuration in an actual integrated circuit in order to ensure strong correlation between them.

Then, to an input of the reference BPF 3, a reference signal having a predetermined frequency is applied from a reference signal source (not shown), and an output of the reference BPF 3 is applied to a phase comparator 4. In the phase comparator 4, phases of the output of the reference BPF 3 and the reference signal are compared with each other, and a control signal (a control voltage or a control current) for controlling the reference BPF 3 is outputted.

A BPF generally has a characteristic shown in FIG. 8A, wherein a phase becomes 0 degrees at a reference frequency $f_0$, the phase varies up to minus 90 degrees when a frequency is deviated toward a higher direction, and the phase varies up to plus 90 degrees when a frequency is deviated toward a lower direction. Therefore, a level of the control signal from the phase comparator 4 represents a phase deviation, i.e., frequency deviation of the output of the reference BPF 3 and, by controlling the reference BPF 3 by means of the control signal, it is possible to adjust the reference BPF 3 such that a center frequency of the reference BPF 3 becomes coincident with a frequency $f_0$ of the reference signal.

On the other hand, since the BPF's 2a and 2b to be controlled have a strong correlation to the reference BPF 3 as described above, by applying the control signal for controlling the reference BPF 3 to these BPF's 2a and 2b as control signals therefor, the BPF's 2a and 2b can be controlled in the same manner as that of the reference BPF 3, and as a resulting, center frequencies of the BPF's 2a and 2b become coincident with the frequency $f_0$ of the reference signal.

In addition, in a case of the conventional circuit shown in FIG. 6, the reference BPF 3 may be replaced with an all-pass filter. In this case, the all-pass filter has a characteristic shown in FIG. 8B, for example. That is, in the all-pass filter, a phase is minus 180 degrees at a reference frequency $f_0$, the phase varies up to minus 360 degrees when the frequency becomes high, and the phase varies up to 0 degrees when the frequency becomes low. Therefore, even if the all-pass filter is used instead the reference BPF 3, it is possible to perform an operation similar to that described above.

In another conventional circuit 1 as shown in FIG. 7, a fact that an output of a BPF is 0 degrees in phase at a reference frequency $f_0$ and a fact that the BPF oscillates at $f_0$ by positively feeding-back the output of the BPF to an input thereof by means of a loop having a gain of one or more are utilized. That is, in the prior art shown in FIG. 7, an amplifier 5 having a gain of one or more is connected between the output and the input of the reference BPF 3, and the output of the reference BPF 3 is positively fed-back to the input thereof through the amplifier 5. Then, an oscillation output signal of the reference BPF 3 is compared with the reference signal by the phase comparator 4 and a control signal is outputted from the phase comparator 4. As similar to the prior art in FIG. 6, the control signal is applied to the BPF's 2a and 2b to be controlled and to the reference BPF 3.

In any of the prior art shown in FIG. 6 and FIG. 7, since the BPF's 2a, 2b and 3 are formed on the same integrated circuit chip, the same show relatively strong correlation therebetween; however, when the respective BPF's 2a, 2b and 3 are to be adjusted at the same frequency $f_0$, actually, there is a deviation or fluctuation of a frequency at a degree of about ±2% due to dispersion of components in the integrated circuit.

In addition, when the BPF 2a and BPF 2b are to be adjusted at different frequencies, that is, when the center frequency of the BPF 2a is adjusted to be coincident with the center frequency of the reference BPF 3 and the center frequency of the BPF 2b is to be adjusted at a half of the center frequency of the reference BPF 3, the control current from the phase comparator 4 is halved and applied to the BPF 2b. In this case, since dispersion of components of a circuit for adjusting the control current are added to the above described dispersion, the frequency may be deviated at a degree of about 5%.

Furthermore, in the prior art shown in FIG. 6, when a BPF having a high quality factor (Q) is utilized as the reference BPF in order to respond to a requirement of high accuracy, if the reference frequency $f_0$ and the frequency of the reference BPF are deviated from each other, an output level from the reference BPF becomes small, and therefore, there is an occasion where the reference BPF cannot be controlled.

SUMMARY OF THE INVENTION

Therefore, a principal object of the present invention is to provide a BPF circuit in which a BPF can be controlled with high accuracy.

In brief, a BPF circuit in accordance with the present invention comprises a first BPF; reference signal applying means for applying a reference signal; phase-comparing means for phase-comparing an output of a first BPF with the reference signal to output a control signal for controlling the first BPF; level limiting means for receiving the output signal from the first BPF; and adding means for applying an output from the level limiting means and the reference signal in a superposed manner to an input of the first BPF.

To the input of the first BPF, a signal in which the reference signal and the output of the first BPF through the level limiting means are added to each other is applied. If a level of a reference signal component contained in the output of the first BPF becomes smaller than a predetermined level because a frequency of the reference signal and a frequency of the first BPF are deviated from each other, a positive feed-back loop including the level limiting means is formed. Consequently, in the phase comparing means, an oscillation output from the first BPF and the reference signal are phase-compared with each other.

In addition, when the deviation between the frequency of the reference signal and a center frequency of the first BPF is relatively small, the first BPF does not oscillate, and therefore, the phase comparing means compares the reference signal component included in the output of the first BPF and the reference signal with each other.

In one embodiment, a control signal from the phase comparing means is directly applied to the first BPF; however, in another embodiment, the control signal is applied to a second BPF to be controlled. In the former embodiment, the above described superposed signal and an input signal are switched by a switch so that one of them can be applied to the input of the first BPF in a time-sharing manner. Then, as necessary, a switch and a sample hold circuit are connected to the output of the first BPF to remove a reference signal component included in the output signal of the first BPF.

In accordance with the present invention, since an oscillation circuit is automatically constructed by the first BPF when the frequency of the reference signal and the frequency of the BPF are deviated from each other, as different from the prior arts, there is no occasion where the BPF cannot be controlled, and therefore, it is possible to stably and surely control the BPF.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 4A and FIG. 4B are block diagrams respectively showing operations of FIG. 1 embodiment;

FIG. 7 is a block diagram showing another prior art; and

DETAILED DESCRIPTION OF THE PREFERRED EMBODIMENTS

Figure 1:
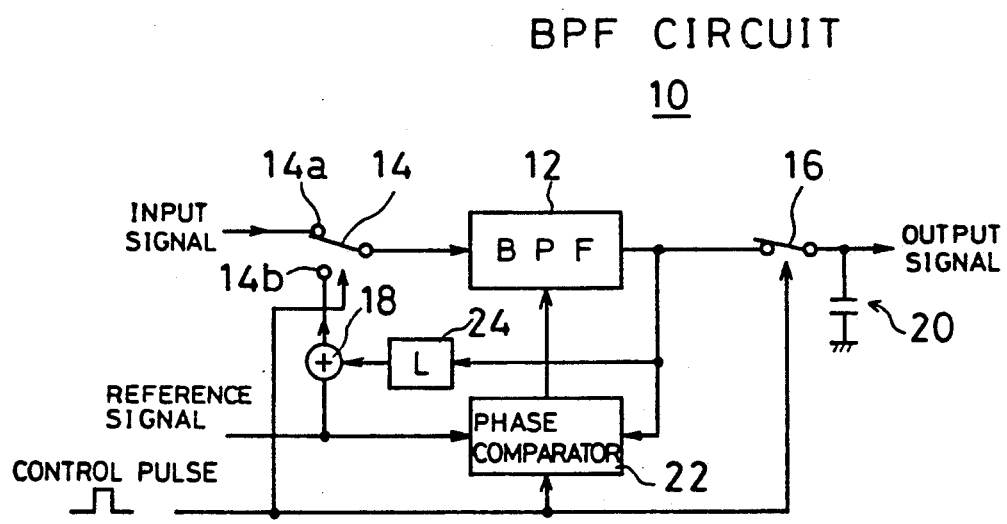
FIG. 1 is a block diagram showing one embodiment in accordance with the present invention.

A BPF circuit 10 of one embodiment in accordance with the present invention, as shown in FIG. 1, includes a BPF 12, and a switch 14 is connected to an input of the BPF 12 and a switch 16 is connected to an output thereof. An input signal is applied to a contact 14a of the switch 14 and an output of an adder 18 is applied to a contact 14b. The switch 14 is controlled by a control pulse, and therefore, to the BPF 12, the input signal or the output of the adder 18 is applied in a time-sharing manner. Specifically, in a case where the input signal is a chrominance signal, during a period between the chrominance signal and a burst signal, the switch 14 is switched to a side of the contact 14b so that the output of the adder 18 can be applied to the BPF 12.

The switch 16 is also turned-on or -off by the control pulse and, during a period when the switch 16 is turned-off, the output of the BPF 12 is sampled and held by a sample hold circuit 20. Therefore, when the chrominance signal is inputted to the BPF 12 through the switch 14, the output of the BPF 12 is outputted through the switch 16 as it is. However, during a period when the output of the adder 18 is inputted to the BPF 12, an output of the sample hold circuit 20 is withdrawn as an output signal. Therefore, it is possible to prevent the reference signal from being superposed or added to the output signal (chrominance signal) and being outputted.

The output of the BPF 12 is also applied to one input of a phase comparator 22, and the other input of the phase comparator 22 receives the reference signal. Although not shown, the phase comparator 22 includes the same combination as that of the switch 16 and the sample hold circuit 20 and, when the reference signal exists at the output of the BPF 12, the reference signal is not used as a phase-comparing signal. An output of the phase comparator 22 is directly applied to a control input of the BPF 12.

The output of the BPF 12 is further applied to the adder 18 through a limiting amplifier (hereinafter, may be called as "limiter" simply) 24. The reference signal is further applied to the adder 18. Therefore, from the adder 18, a superposed signal obtained by adding the output of the BPF 12 which is a constant level through the limiter 14 and the reference signal is outputted.

Figure 2A:
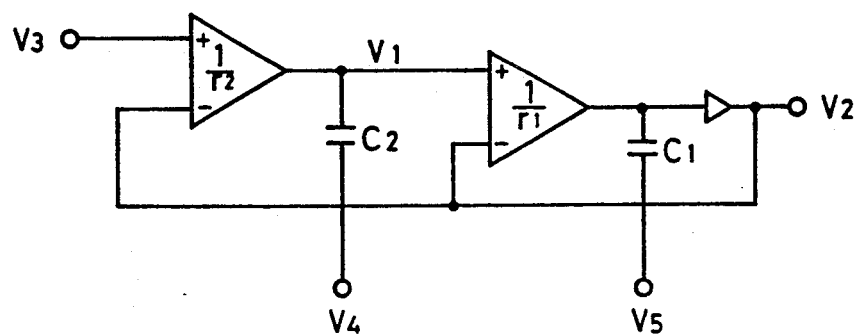
FIG. 2A and FIG. 2B are circuit diagrams respectively showing different examples of a variable filter which can be utilized in the embodiment.
Figure 2B:
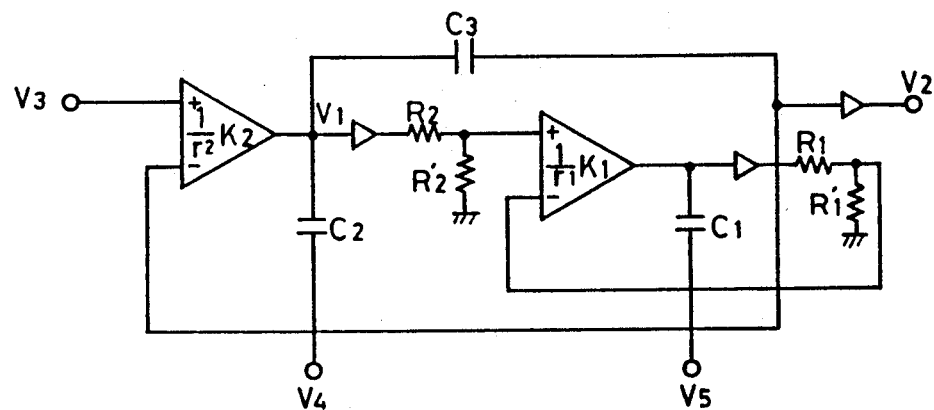

As the above described BPF 12, a variable filter of a type incorporated in an integrated circuit as shown in FIG. 2A or FIG. 2B (and FIG. 3) can be utilized.

A characteristic of a variable filter shown in FIG. 2A becomes as follows:

$$j\omega c_2(v_1 - v_4) = (v_3 - v_2)\frac{1}{r_2} \quad (1)$$

$$j\omega c_1(v_2 - v_5) = (v_1 - v_2)\frac{1}{r_1} \quad (2)$$

If $v_1$ is eliminated from the equations (1) and (2), the following equation (3) can be obtained.

$$j\omega c_1 j\omega c_2 r_1 r_2 v_2 - j\omega c_1 j\omega c_2 r_1 r_2 v_5 = v_3 - v_2 + j\omega c_2 r_2 v_4 - j\omega c_2 r_2 v_2 \quad (3)$$

In a case where such a variable filter is constructed as a low pass filter, it is set as $v_4 = v_5 = 0$, $v_3 = v_{in}$ and $v_2 = v_{out}$.

In this case, a transfer function is given by a following equation (4) on the assumption that $j\omega = S$.

$$T(S) = \frac{v_2}{v_3} = \frac{v_{out}}{v_{in}} \quad (4)$$

$$= \frac{\frac{1}{r_1 r_2 c_1 c_2}}{S^2 + S \cdot \frac{r_2 c_2}{r_1 r_2 c_1 c_2} + \frac{1}{r_1 r_2 c_1 c_2}}$$

$$= \frac{\omega_0^2}{S^2 + \frac{\omega_0}{Q}S + \omega_0^2}$$

Accordingly, a frequency and a quality factor Q are given by following equations (5) and (6).

$$\omega_0 = \sqrt{\frac{1}{r_1 r_2 c_1 c_2}} \tag{5}$$

$$Q = \sqrt{\frac{c_1 r_1}{c_2 r_2}} \tag{6}$$

In a case where the above described variable filter is constructed as a BPF, it is set as $v_3 = v_5 = 0$, $v_4 = v_{in}$ and $v_2 = v_{out}$, and therefore, a transfer function, frequency and Q are respectively given by equations (7), (8) and (9) on the assumption that $j\omega = S$.

$$T(S) = \frac{v_2}{v_4} = \frac{v_{out}}{v_{in}} \tag{7}$$

$$= \frac{\frac{1}{r_1 r_2 c_1 c_2}}{S^2 + S \cdot \frac{r_2 c_2}{r_1 r_2 c_1 c_2} + \frac{1}{r_1 r_2 c_1 c_2}}$$

$$= \frac{\frac{\omega_0}{Q} S}{S^2 + \frac{\omega_0}{Q} S + \omega_0^2}$$

$$\omega_0 = \sqrt{\frac{1}{r_1 r_2 c_1 c_2}} \tag{8}$$

$$Q = \sqrt{\frac{c_1 r_1}{c_2 r_2}} \tag{9}$$

Otherwise, the variable filter can operate as a high-pass filter by setting as $v_3 = v_5 = v_{in}$, $v_4 = 0$, and $v_2 = v_{out}$ or as an all-pass filter by setting as $v_3 = v_5 = v_{in}$, $v_4 = -v_{in}$, and $v_2 = v_{out}$. That is, by suitably selecting an input and an output terminal, it is possible to construct various kinds of filter with the same filter configuration.

Figure 3:
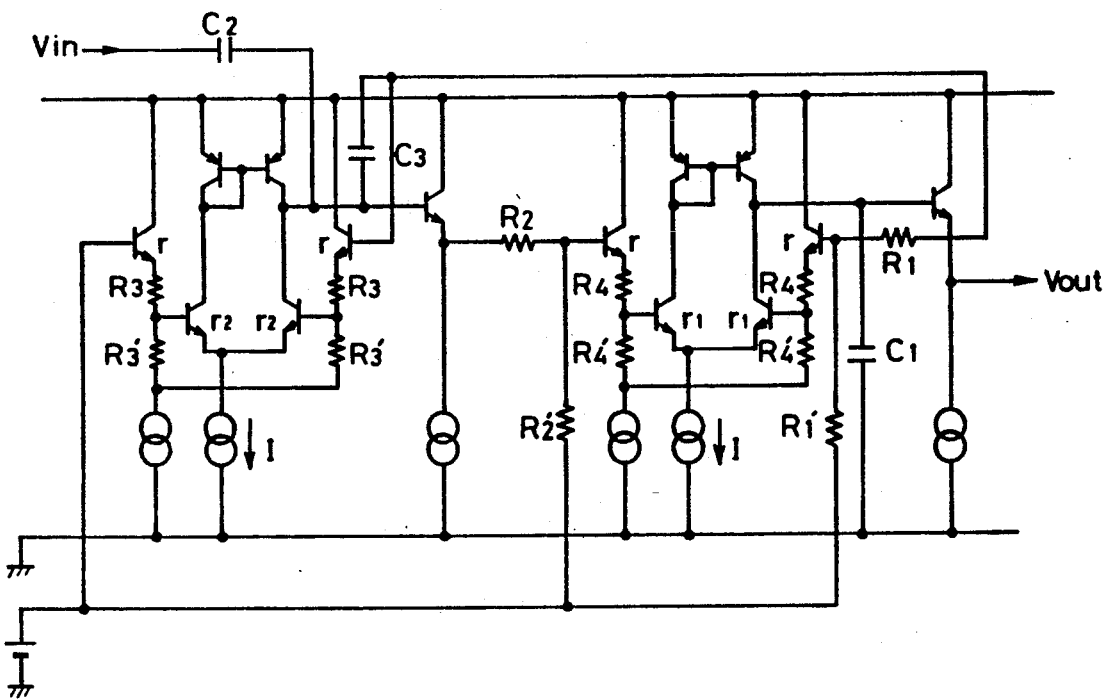
FIG. 3 is a circuit diagram showing in detail the variable data shown in FIG. 2B.

FIG. 2B shows a filter configuration used in FIG. 1 embodiment, and a detailed circuit thereof is shown in FIG. 3. In this case, a characteristic becomes as follows:

$$j\omega c_2(v_1 - v_4) + j\omega c_3(v_1 - v_2) = (v_3 - v_2)\frac{1}{r_2}K_2 \tag{10}$$

$$j\omega c_1(v_2 - v_5) = (v_1 L_2 - v_2 L_1)\frac{1}{r_1}K_1$$

$$L_1 = \frac{R_1'}{R_1 + R_1'} \quad L_2 = \frac{R_2'}{R_2 + R_2'}$$

$$K_1 = \frac{R_4'}{R_4 + R_4'} \quad K_2 = \frac{R_3'}{R_3 + R_3'} \tag{11}$$

Since the variable filter is used as a BPF, as described above, it is set as $v_3 = v_5 = 0$, $v_4 = v_{in}$, and $v_2 = v_{out}$, and $v_1$ is eliminated from the equations (10) and (11), a transfer function and a frequency are respectively given by equations (12) and (13) on the assumption that $j\omega = S$.

$$T(S) = \frac{v_2}{v_4} = \frac{v_{out}}{v_{in}} \tag{12}$$

$$= \frac{S \frac{L_2 K_1}{c_1 \left(1 + \frac{c_3}{c_2}\right) r_1}}{S^2 + S \cdot \frac{L_1 K_1}{c_1 \left(1 + \frac{c_3}{c_2}\right) r_1} + \frac{K_2 K_1 L_2}{c_1 c_2 r_1 r_2 \left(1 + \frac{c_3}{c_2}\right)}}$$

$$\omega_0 = \sqrt{\frac{K_2 K_1 L_2}{c_1 c_2 r_1 r_2 \left(1 + \frac{c_3}{c_2}\right)}} \tag{13}$$

$$r_1 = r_2 = \frac{2kT}{qI}$$

$$\omega_0 = \frac{qI}{2kT}\sqrt{\frac{K_2 K_1 L_2}{c_1 c_2 \left(1 + \frac{c_3}{c_2}\right)}}$$

Therefore, by changing I of respective differential pairs shown in FIG. 3, it is possible to vary the center frequency $f_0$ of the BPF. Therefore, in FIG. 1 embodiment, the output of the phase comparator 22, i.e., the control signal controls the currents I.

In FIG. 1 embodiment, in a case where the center frequency of the BPF 12 is largely deviated due to an external disturbance, if the Q of the BPF 12 is high, a level of the reference signal component outputted from the BPF 12 is lowered, and therefore, there is an occasion where the BPF 12 cannot be controlled. In this case, in the FIG. 1 embodiment, the BPF 12 is caused to oscillate and, by utilizing an oscillation frequency, it is controlled such that the center frequency of the BPF 12 is retracted or returned to a vicinity of the frequency $f_0$ of the reference signal. This will be described with reference to FIG. 4A and FIG. 4B.

In FIG. 4A, a level of the output $v_{out}$ of the reference signal component which depends on the input $v_{in}$ of the reference signal becomes smaller than an oscillation level, the BPF oscillates at the frequency $f_0$ of the reference signal.

On the assumption that a transfer function of the BPF is F(S), a following equation (14) is given.

$$F(S) = \frac{\frac{\omega_0}{Q} S}{S^2 + \frac{\omega_0}{Q} S + \omega_0^2} \tag{14}$$

$$v_1 = v_{in} + v_2 \quad v_2 = Av_{out}$$
$$v_{out} = v_1 F(S)$$
$$v_{out} = (v_{in} + Av_{out})F(S)$$

The above described transfer function is given by an equation (15).

$$\frac{v_{out}}{v_{in}} = \frac{F(S)}{1 - AF(S)} \tag{15}$$

Accordingly, an equation (16) can be obtained.

$$T(S) = \frac{F(S)}{1 - AF(S)} = \frac{\frac{\omega_0}{Q} S}{S^2 + (1 - A)\frac{\omega_0}{Q} S + \omega_0^2} \quad (16)$$

As shown in FIG. 4B, if the BPF 12 oscillates in FIG. 1 embodiment, the reference signal is not passed through the BPF 12, and therefore, the transfer function is given by an equation (17).

$$|F(S)| = \sqrt{\frac{\left(\frac{\omega_0}{Q} \omega\right)^2}{(\omega_0^2 - \omega^2)^2 + \left(\frac{\omega_0}{Q} \omega\right)^2}} \quad (17)$$

In a case of $\omega_o = \omega$, since $|F(S)| = 1$, an equation (18) is obtainable in FIG. 4B.

$$\frac{v_2}{v_{in}} = \frac{A}{1 - A} \quad (18)$$

Since a limiting amplifier is inserted, actually, $v_2$ is a constant level, and therefore, a gain A is changed in accordance with an input level to the limiting amplifier.

If a level ratio by which $v_{in}$ and $v_2$ are added to each other is B, $$\frac{v_2}{v_{in}} = B, \text{ where } B > 1 \quad (19)$$

$$\frac{v_2}{v_{in}} = B = \frac{A}{1 - A}$$

$$A = \frac{B}{1 + B}$$

$|T(S)|$ is evaluated by substituting the above into T(S), an equation (20) is obtainable.

$$|T(S)| = \sqrt{\frac{\left(\frac{\omega \omega_0}{Q}\right)^2}{(\omega_0^2 - \omega^2)^2 + \left(\frac{1}{1 + B} \cdot \frac{\omega \omega_0}{Q}\right)^2}} \quad (20)$$

If $|T(S)| > B$, a frequency of the input $v_{in}$ is looped. If $|T(S)| < B$, the output of the BPF 12 dependent on the input $v_{in}$ becomes smaller than the oscillation level, and therefore, the BPF 12 oscillates.

In addition, it is possible to suitably set a range wherein the BPF is controlled by the superposed signal from the adder 18 and a range wherein the BPF is controlled by the oscillation, by addition ration of the levels of $v_{in}$ and $v_2$.

Thus, in FIG. 1 embodiment, when the level of the reference signal component contained in the output of the BPF 12 becomes smaller than a predetermined level which is determined by the limiter 24, automatically, the oscillation circuit is constructed by the BPF 12, and therefore, the BPF 12 can be stably and surely controlled always.

Figure 5:
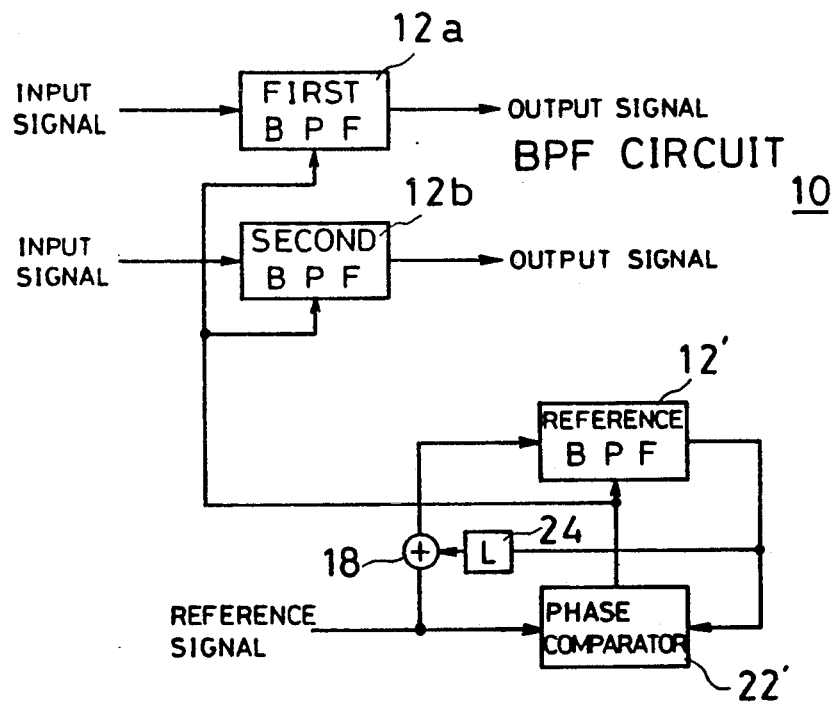
FIG. 5 is a block diagram showing another embodiment in accordance with the present invention.
Figure 6:
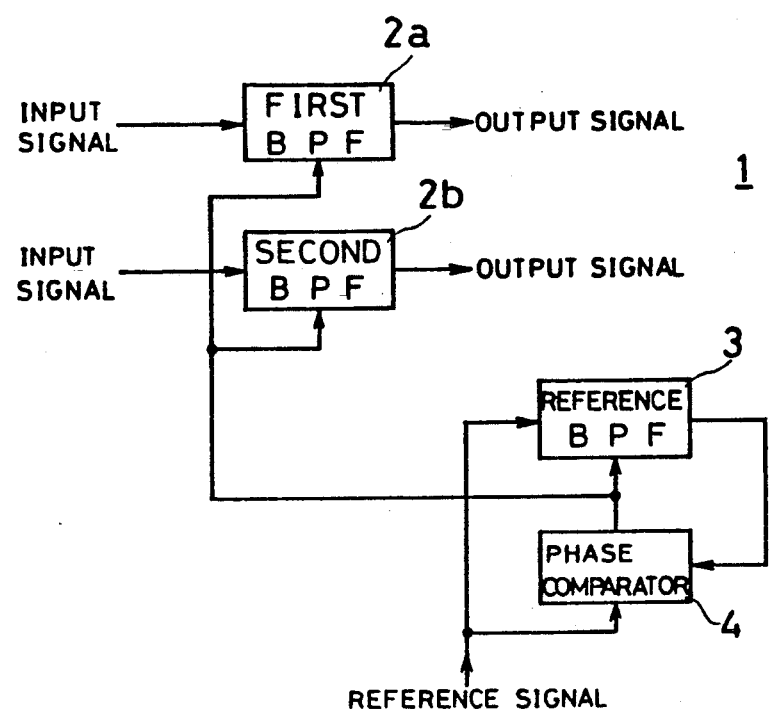
FIG. 6 is a block diagram showing a prior art.
Figure 8A:
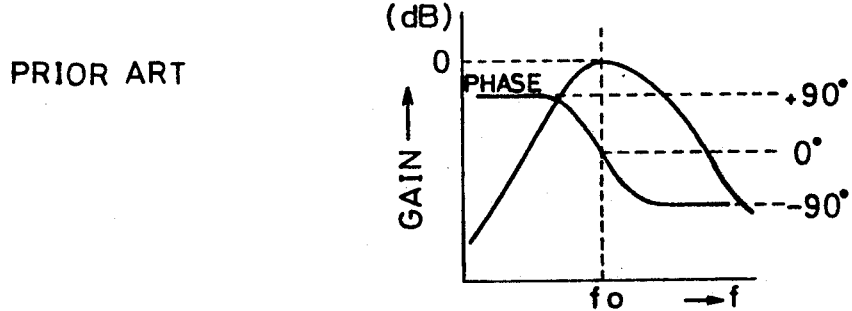
FIG. 8A and FIG. 8B are graphs respectively showing characteristics of a BPF and an all-pass filter.
Figure 8B:
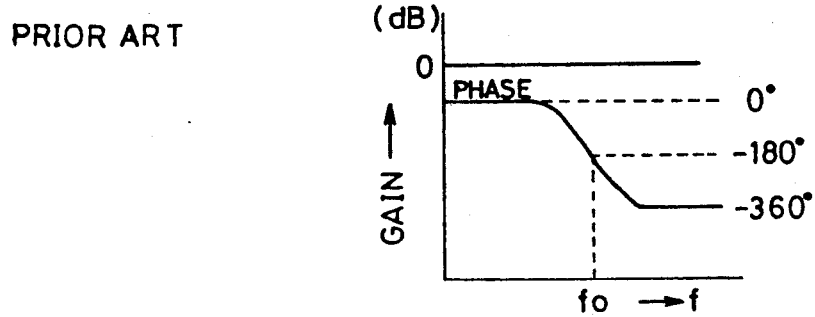

In FIG. 1 embodiment, the output of the phase comparator 22 is directly applied to the BPF 12; however, an embodiment shown in FIG. 5, such the BPF 12 is used as a reference BPF 12'. That is, in FIG. 5 embodiment, the reference BPF 12' having the same structure as that of the BPF 12 in FIG. 1 embodiment is used and, in the phase comparator 24, an output of the reference BPF 12' and the reference signal are phase-compared with each other. Then, the output of the phase comparator 24, i.e., control signal is applied to the reference BPF 12' as well as BPF's 12a and 12b to be controlled. Therefore, the BPF's 12a and 12b can be controlled in the same manner as that of the reference BPF 12' as similar to FIG. 7 prior art. Resultingly, it is controlled such that the center frequency of the BPF's 12a and 12b becomes frequency which is the same as that of the reference BPF 12' or having predetermined relationship with the reference BPF 12'.

Thus, in the present invention, a method in which a center frequency of the BPF is controlled by inputting the reference signal to the BPF and a method in which the center frequency of the BPF is controlled by oscillating the BPF are used jointly, that is, the methods are automatically changed, and therefore, it is possible to stably control the BPF 12 (or 12a, 12b and 12') always.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable band-pass filter circuit, comprising:
   a first variable band-pass filter;
   reference signal applying means for applying a reference signal;
   phase-comparing means for phase-comparing an output signal of said first variable band-pass filter with said reference signal to output a control signal for controlling said first variable band-pass filter;
   level limiting means for receiving said output signal from said first variable band-pass filter;
   adding means for adding an output from said level limiting means and said reference signal to each other so as to apply the same to an input of said first variable band-pass filter; and
   a first switch which is controlled by a switching signal in a first state wherein an input signal to be filtered by said variable band-pass filter circuit is applied to said input of said first variable band-pass filter through said first switch or in a second state wherein an output of said adding means is applied to said input of said first variable band-pass filter through said switch.

2. A variable band-pass filter circuit in accordance with claim 1, further comprising sample hold means for sampling and holding said output of said first variable band-pass filter in synchronization with switching of said first switch, whereby a reference signal component contained in said output of said first variable band-pass filter can be prevented from being outputted from said first variable band-pass filter.

3. A variable band-pass filter circuit in accordance with claim 1, wherein said control signal is further applied to a second variable band-pass filter which receives an input signal to be filtered by said variable band-pass filter circuit, whereby said second variable band-pass filter can be controlled in the same manner as that of said first variable band-pass filter.

4. A variable band-pass filter circuit in accordance with claim 3, wherein said first variable band-pass filter and said second variable band-pass filter are both incorporated in the same integrated circuit chip.

* * * * *